(12) United States Patent
Takaishi

(10) Patent No.: US 6,185,120 B1
(45) Date of Patent: Feb. 6, 2001

(54) SEMICONDUCTOR MEMORY DEVICE

(75) Inventor: Yoshihiro Takaishi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/287,516

(22) Filed: Apr. 7, 1999

(30) Foreign Application Priority Data

Apr. 9, 1998 (JP) .................................................. 10-097801

(51) Int. Cl.$^7$ .................................................. G11C 5/08
(52) U.S. Cl. .................................................. 365/69; 365/51
(58) Field of Search .................................. 365/69, 51, 63, 365/149; 438/239; 257/296

(56) References Cited

U.S. PATENT DOCUMENTS

| | | | |
|---|---|---|---|
| 5,194,752 | * | 3/1993 | Kumagai ............................... 257/390 |
| 5,812,444 | * | 9/1998 | Ema ...................................... 365/149 |
| 5,877,522 | * | 3/1999 | Kasai .................................... 257/306 |
| 6,060,351 | * | 5/2000 | Parekh .................................. 438/253 |

FOREIGN PATENT DOCUMENTS

| | | |
|---|---|---|
| 0 399 531 A1 | 11/1990 | (EP) . |
| 0 428 247 A2 | 5/1991 | (EP) . |
| 0 464 251 A1 | 1/1992 | (EP) . |
| 3-072675 | 3/1991 | (JP) . |
| 4-177758 | 6/1992 | (JP) . |
| 4-211164 | 8/1992 | (JP) . |
| 5-041500 | 2/1993 | (JP) . |
| 7-120714 | 12/1995 | (JP) . |
| 8-078640 | 3/1996 | (JP) . |
| 9-129841 | 5/1997 | (JP) . |

* cited by examiner

Primary Examiner—A. Zarabian
(74) Attorney, Agent, or Firm—Scully, Scott, Murphy & Presser

(57) ABSTRACT

In a semiconductor memory device which utilizes a folded bit line system, a plurality of bit lines are placed in a parallel direction while a plurality of word lines are placed in a vertical direction. A plurality of device region patterns are arranged so as to cross the bit lines and the word lines. A separating distance between adjacent device region patterns is equal to a first space while a separating distance between closest portions of the adjacent device region patterns is equal to a second space. Each of the device region patterns is inclined for the bit line with a predetermined angle so that the first space exceeds the second space.

21 Claims, 7 Drawing Sheets

SEMICONDUCTOR MEMORY DEVICE

BACKGROUND OF THE INVENTION

This invention mainly relates to a semiconductor memory device, such as, a dynamic random access memory (DRAM), which is suitable for high integration and high capacity, and in particular, to a semiconductor memory device having a memory structure in which cells are arranged with cell arrangement pattern of the folded bit line system of one transistor/one capacitor structure.

Recently, high integration and high capacity of a semiconductor memory device have developed rapidly with an advancement of miniaturization in the semiconductor manufacturing field.

In such integration with respect to an integrated circuit of the semiconductor memory device, a cell layout of a memory cell array having the one transistor/one capacitor structure is suitable for the miniaturization.

Further, the cell arrangement pattern of the folded bit line system generally has been applied for the cell layout to achieve large area and high speed.

Alternatively, a variety of cell layouts have been suggested other than the above-mentioned cell layout.

In a conventional memory cell structure illustrated in FIG. 1, cells are arranged with a cell arrangement pattern of the known ½ pitch type folded bit line system of one transistor/one capacitor structure.

In such a memory structure, a plurality of bit lines 102a are placed in a parallel horizontal direction while a plurality of word lines 11a are placed in a vertical direction. Thus, the bit lines 102a and word lines 101a are crossed to each other.

With this structure, a plurality of device region patterns 100a are arranged in a direction parallel to the bit line. In this event, each of the device region patterns 100a is formed in a rectangular shape.

Further, each of the device region patterns 100a has wiring patterns 104a in the both ends and a wiring pattern 103a in a center portion. In this condition, a capacitor contact 106a is arranged in each of the wiring patterns 104a in the device region pattern 100a while a bit contact 105a is arranged in the wiring pattern 103a on the bit line 102a.

In this case, the wiring pattern 103a is patterned and arranged to connect the bit contact 105a with a diffusion layer. Moreover, the wiring pattern 104a is patterned and arranged to connect the capacitor contact 106a with a diffusion layer.

Under this condition, the device region patterns 100a are alternately arranged at every ½ pitch in the direction parallel to the bit line 102a. For instance, the device region patterns 110, 111 and 112, each of which has a width w1, are formed as illustrated in FIG. 1.

In the cell layout illustrated in FIG. 1, when attention is paid for the device region pattern 110 and spaces between adjacent device region patterns 111,112 and the device region pattern 110 are considered, the device region pattern 111 is closest to the device region pattern 110 while the device region pattern 112 is further apart from the device region pattern 110 in comparison with the device region pattern 111.

In this case, a distance between the device region patterns 110 and 111 is equal to a space d while a distance between the device region patterns 110 and 112 is equal to a space s.

The space s is considerably large as compared to the space d. When the space d and the space s are compared to each other, the space d becomes a minimum distance to be formed and processed.

In contrast, the space s is considerably larger than the space d and has a margin in comparison with the minimum space. Consequently, a wasteful area inevitably takes place in the cell layout.

To solve the above-mentioned problem, suggestion has been made about another cell layout in Japanese Patent Publication (JP-B) No. Hei. 7-120714.

In this cell layout, high density of the device region patterns can be achieved by reducing the wasteful region in the memory cell structure to further enhance pattern density of the device region patterns.

In another conventional memory cell structure illustrated in FIG. 2, cells are arranged with cell arrangement pattern of the known ¼ pitch type folded bit line system for achieving the high density of the device region patterns.

In such a memory structure, a plurality of bit lines 102b are placed in a parallel direction while a plurality of word lines 101b are placed in a vertical direction in the same manner as the structure illustrated in FIG. 1. Thus, the bit lines 102b and the word lines 101b are crossed to each other.

With this structure, a plurality of device region patterns 100b are inclined for the bit lines 102b. In this event, each of the device region patterns 100b is formed in a rectangular shape. Herein, both ends of the device region pattern 100b are perpendicularly shaped, as illustrated in FIG. 2.

Further, each of the device region patterns 100b has wiring patterns 104b in both ends and a wiring pattern 103b in a center portion. In this condition, a capacitor contact 106b is arranged in each of the wiring patterns 104b in the device region pattern 100b while a bit contact 105b is arranged in the wiring pattern 103b on the bit line 102b in the device region pattern 100b.

In this case, the wiring pattern 103b is patterned and arranged to connect the bit contact 105b with a diffusion layer. Moreover, the wiring pattern 104b is patterned and arranged to connect the capacitor contact 106b with a diffusion layer.

Under this condition, the device region patterns 100b are alternately arranged at every ¼ pitch on the basis of the bit lines 102b. For instance, the device region patterns 113,114 and 115, each of which has a width w2, are formed as illustrated in FIG. 2.

In the cell layout illustrated in FIG. 2, when attention is paid for the device region pattern 113, and spaces between adjacent device region patterns 114, 115 and the device region pattern 113 are considered, the device region pattern 114 is closest to the device region pattern 113.

In this case, a distance between the device region patterns 113 and 114 is equal to a space d while a distance between the device region patterns 113 and 115 is equal to a space d'. This space d' is considerably small in comparison with the space s illustrated in FIG. 1. Consequently, field integration is increased in the cell layout illustrated in FIG. 2.

In this case, when the cell layouts of the memory cell structures illustrated in FIGS. 1 and 2 are compared to each other, it is assumed that the cell sizes are identical to each other.

Under this circumstance, when the space d' of the ¼ pitch type is equal to the space d of the ½ pitch type (namely, d =d'), the width w2 of each device region pattern 113, 114 and 115 of the ¼ pitch type exceeds the width w1 of each device region 110, 111 and 112 of the ½ pitch type (namely, w1<w2).

On the other hand, when the widths of the respective device region patterns are identical to each other (w1 =w2), the space d' of the ¼ pitch type exceeds the space d of the ½ pitch type (namely, d' >d).

Alternatively, when the spaces and widths of the respective device region patterns are identical to each other, the cell size can be reduced in the cell layout of the ¼ pitch.

In the meanwhile, there are Japanese Unexamined Patent Publications No. Hei. 2-226763 and No. Hei 4-65872 as the other conventional techniques related to the semiconductor memory device.

In the case of the semiconductor memory device having the memory structure due to the cell layout of the ¼ pitch type, when attention is paid for the wiring pattern of the capacitor contact for connecting with the diffusion layer, the diffusion layer is arranged with the minimum space same as the memory cell structure due to the cell structure of the ½ pitch type.

However, when shrinkage and deviation occur during the formation of the pattern in such a structure, the diffusion layer of the capacitor contact is not sufficiently formed.

Consequently, the contacting area of the diffusion layer and the wiring pattern of the capacitor contact is inevitably increased. As a result, contact resistance is also increased.

SUMMARY OF THE INVENTION

It is therefore an object of this invention to provide a semiconductor memory device having a memory structure due to a cell layout which is capable of reducing contact resistance by widening the separating distance or space between capacitor contacts.

According to this invention, a semiconductor memory device utilizes the known folded bit line system.

With this structure, a plurality of bit lines are placed in a parallel direction while a plurality of word lines are placed in a vertical direction. In this event, the bit lines and the word lines are perpendicularly crossed to each other.

Further, a plurality of device region patterns are arranged so as to cross the bit lines and the word lines.

In this case, a separating distance between adjacent device region patterns is equal to a first space while a separating distance between closest portions of the adjacent device region patterns is equal to a second space.

In this condition, each of the device region patterns is inclined for the bit line with a predetermined angle so that the first space exceeds the second space.

Moreover, the device region pattern has first wiring patterns in both ends and a second wiring pattern in a center portion. In this event, a capacitor contact is arranged in each of the first wiring patterns while a bit contact is arranged in the second wiring pattern. Herein, the first space corresponds to a vertical distance between the capacitor contacts.

The first wiring pattern is patterned and arranged so as to connect the capacitor contact with a first diffusion layer while the second wiring pattern is patterned and arranged so as to connect the bit contact with a second diffusion layer.

In this case, the second space exceeds a predetermined minimum separating space.

It is desirable that each of the device region patterns is inclined with the angle which is not exceeding approximately 26 degree.

It is more preferable that each of said device region patterns is inclined with the angle which is not exceeding approximately 13 degree.

Under this circumstance, the device region patterns are alternately arranged at every ¼ pitch on the basis of the bit line.

More specifically, each of the device region patterns is inclined for the bit line with the predetermined angle so that the first space exceeds the second space in this invention, as mentioned before.

Consequently, high density of the device region pattern becomes possible.

Further, when the area of the memory cell array is the same, the separating distance of the device region pattern can be widened. In particular, the distance between the capacitor contacts can be widened. In consequence, the increase of the contact resistance can be suppressed, and the electrical characteristics are improved.

Namely, the distance (space) between the capacitor contacts can be widened by adjusting the inclined angle as compared to the conventional ¼ pitch type cell layout.

As a result, electrical characteristic is enhanced and further, the degree of freedom with respect to mask layout can be increased.

DESCRIPTION OF THE PREFERRED EMBODIMENTS (First embodiment)

Figure 3:
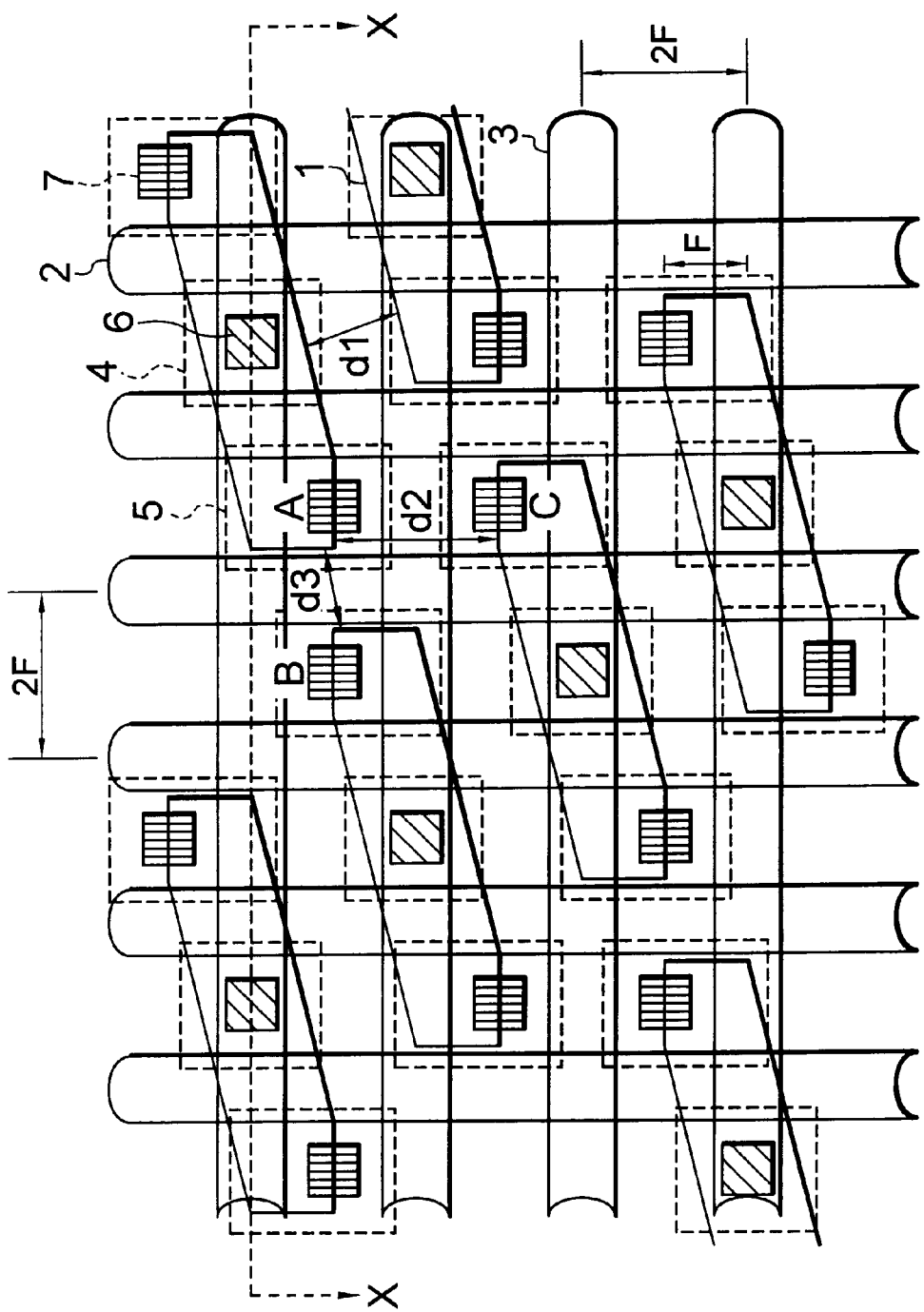
FIG. 3 is a plane view showing a memory cell structure in which cell patterns are arranged with cell wiring pattern of the folded bit system according to a first embodiment of this invention.

Referring to FIG. 3, description will be made about a semiconductor memory device according to a first embodiment of this invention. The semiconductor memory device according to the first embodiment has cell arrangement pattern of the folded bit line system.

Figure 1:
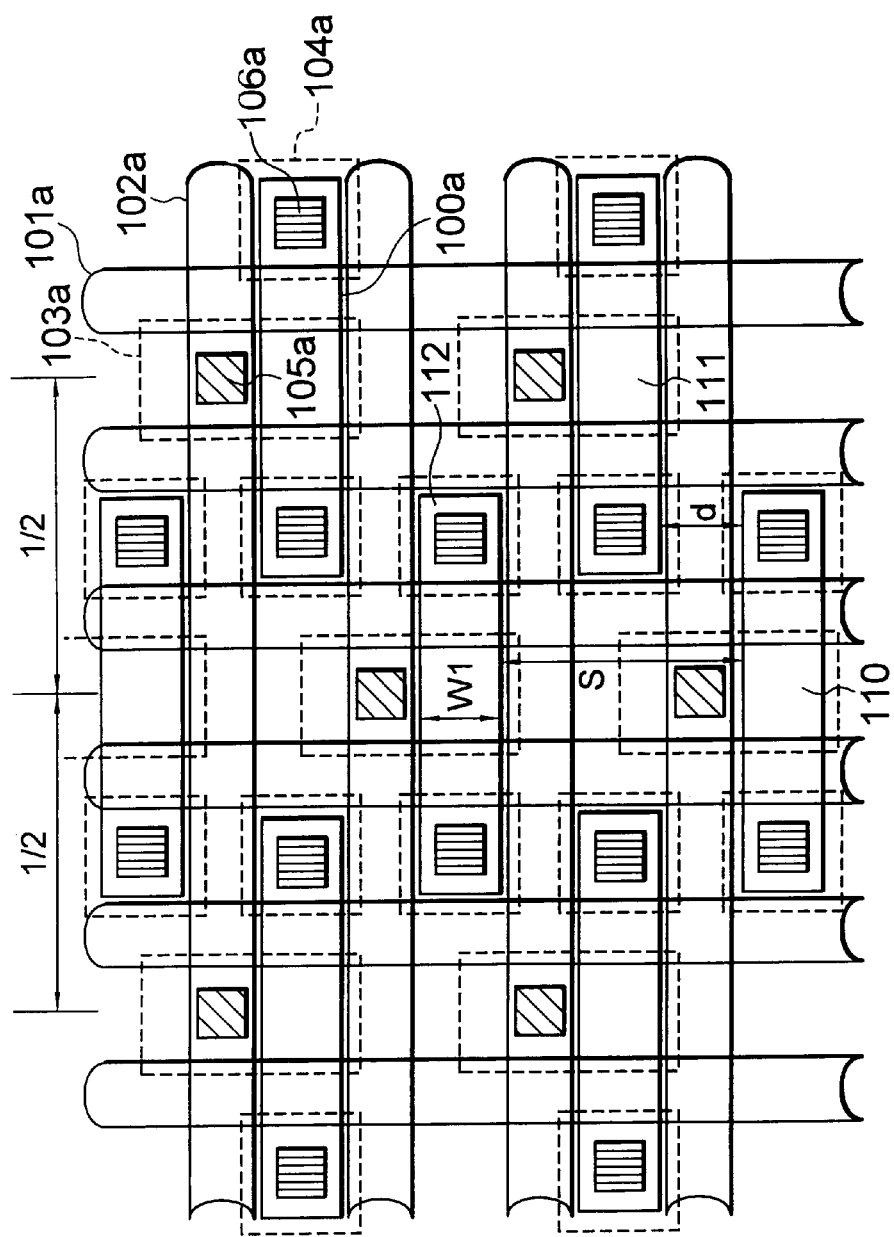
FIG. 1 is a plane view showing a conventional memory cell structure in which cells patterns are arranged with cell wiring pattern of the ½ pitch type folded bit system.
Figure 2:
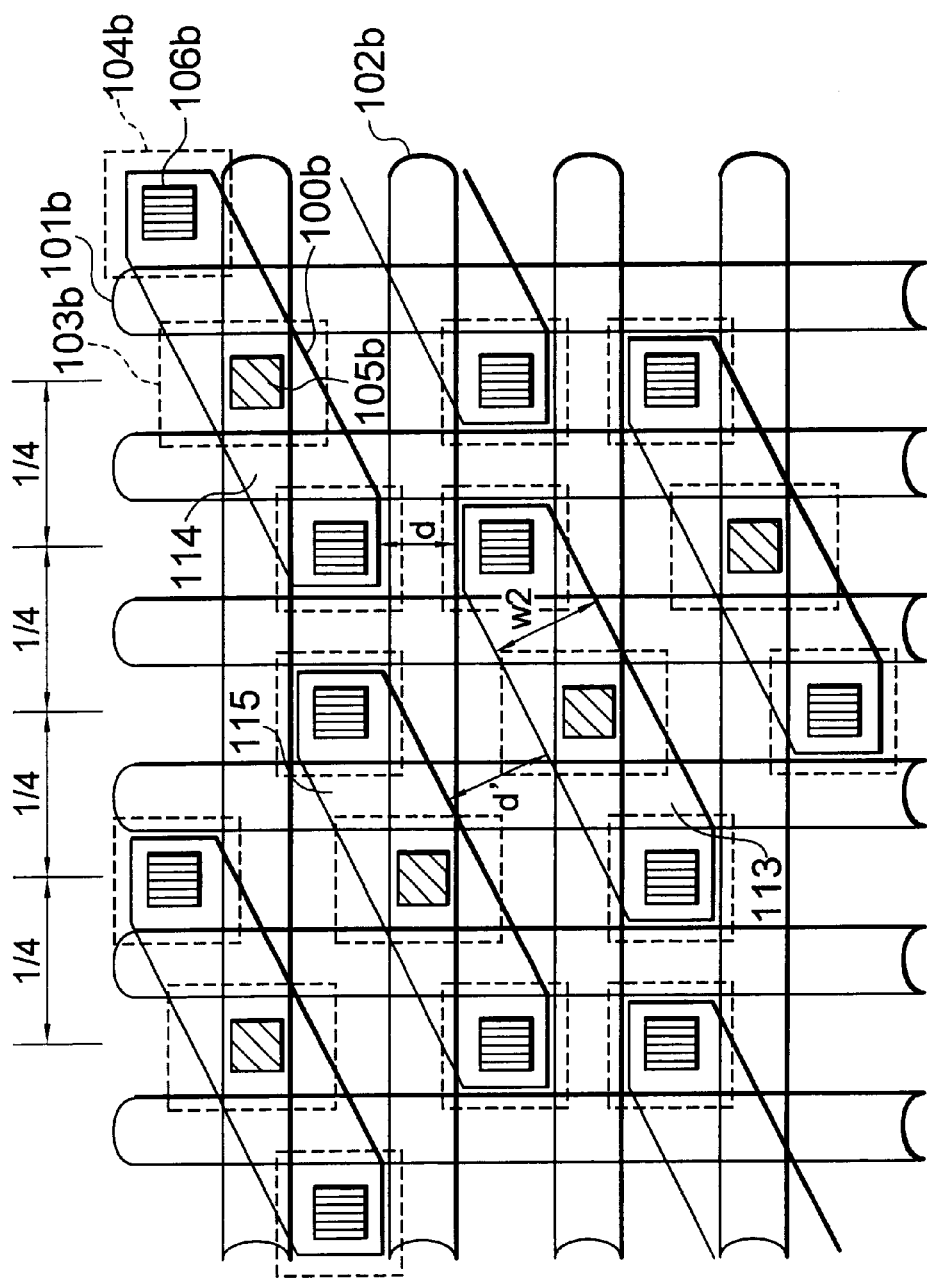
FIG. 2 is a plane view showing a conventional memory cell structure in which cells patterns are arranged with cell wiring pattern of the ¼ pitch type folded bit system.

In such a memory structure, a plurality of bit lines 3 are placed in a parallel direction while a plurality of word lines 2 are placed in a vertical direction in the same manner as the structure illustrated in FIG. 2. Thus, the bit lines 3 and the word lines 2 are crossed to each other.

With this structure, a plurality of device region patterns 1 are inclined for the bit lines 3. In this event, each of the device region patterns 1 is formed in a generally rectangular shape. Herein, both ends of the device region pattern 1 include two perpendicularly oriented surfaces parallel to the word and bit lines.

Herein, it is to be noted that the device region pattern 1 is inclined with an angle at which separating spaces d1 and d2 between the adjacent device region patterns exceed separating space d3 of the closest portion.

Further, each of the device region patterns 1 has wiring patterns 5 in both ends and a wiring pattern 4 in a center portion. In this condition, a capacitor contact 7 is arranged in each of the wiring patterns 5 in the device region pattern 1 while a bit contact 6 is arranged in the wiring pattern 4 in the device region pattern 1.

In this case, the wiring pattern 4 is patterned and arranged to connect the bit contact 6 with a diffusion layer. Moreover, the wiring pattern 5 is patterned and arranged to connect the capacitor contact 7 with a diffusion layer.

Under this condition, the device region patterns 1 are alternately arranged at every ¼ pitch on the basis of the bit lines 3.

Namely, it is assumed that each repeating pitch of the word lines 2 and the bit lines 3 is equal to 2F in such a memory cell structure. In this case, the cell having area of $8F^2$ can be realized in the folded bit line system.

In this event, the layout of the formable minimum cell can be obtained by setting the value F to the minimum distance.

In the case of the memory cell structure illustrated in FIG. 3, the device region pattern 1 is inclined for the bit line 3. Thereby, the separating space d1 between the adjacent device region patterns 1 exceeds the distance F.

Further, the wiring pattern 5 contacts with the diffusion layer at portions A and B illustrated in FIG. 3 in the device region pattern 1. Therefore, the portions A and B are most strict regions for electrically separating the device region patterns 1.

Herein, it is to be noted that the separating space d3 between the portions A and B is set to the minimum separating distance F in the normal ¼ pitch type cell layout.

Figure 4:
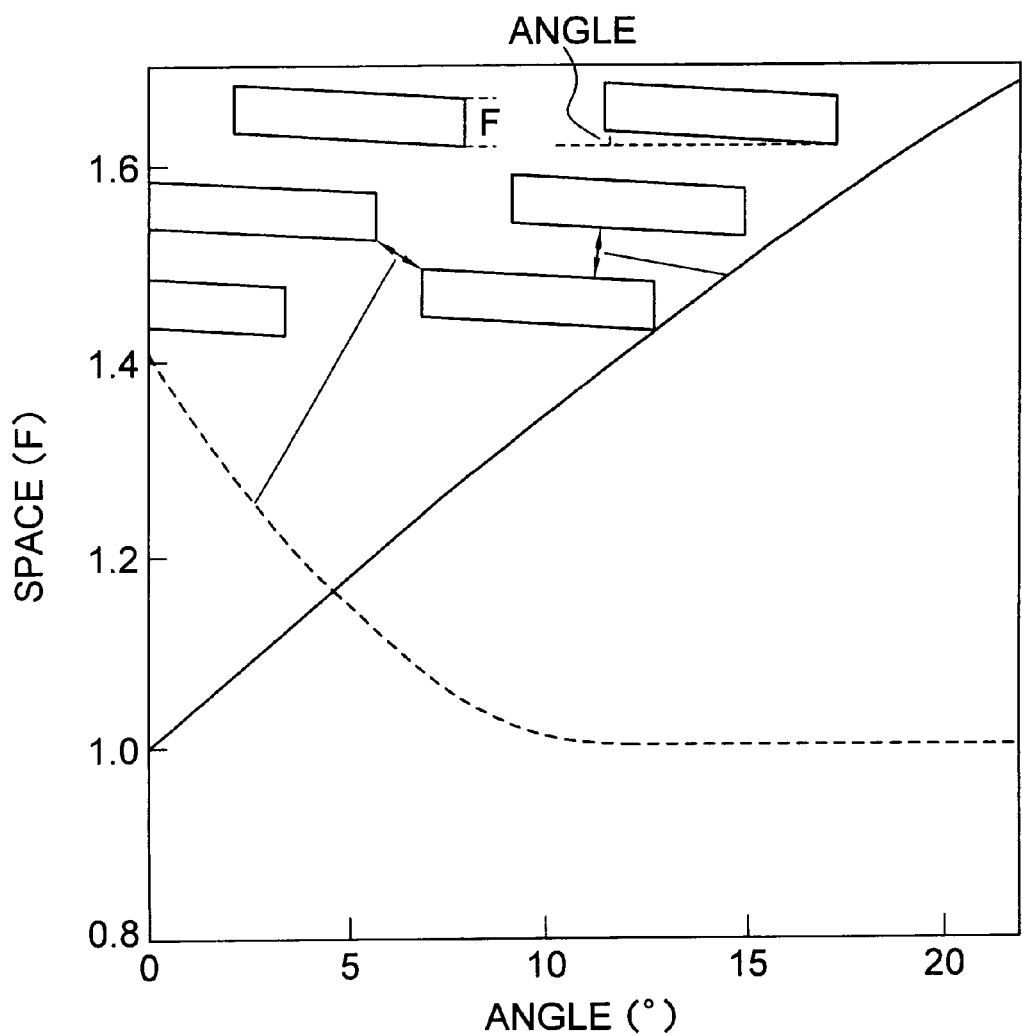
FIG. 4 is a diagram showing a relationship between inclined angles and spaces between device region patterns in the memory cell structure illustrated in FIG. 3.

When the width of the diffusion layer is set to F and the device region pattern 1 is inclined for the bit line 3 in ¼ pitch type cell layout, the relationship between the inclined angle and the space (F) between the device region patterns 1 is illustrated in FIG. 4.

The space (F) between the adjacent device region patterns 1 is illustrated by a solid line. Further, the space (F) between the diffusion layers, in which the capacitor contacts 7 are formed, is illustrated by the broken line.

As indicated by the solid line, when the inclined angle becomes larger, the space (F) also becomes longer. On the other hand, when the inclined angle becomes larger, the space (F) is shorter as indicated by the broken line.

In this case, when the inclined angle exceeds about 13 degree, the space becomes the minimum separating distance (F).

Although the device region pattern 1 is inclined with about 26 degree in the normal (conventional) ¼ pitch type cell layout, the device region pattern 1 is inclined with 13 degree or less for the bit line 3 in the cell layout according to this invention. In this event, the separating space d3 between the portions A and B illustrated in FIG. 3 exceeds the minimum separating distance (F).

In this case, the separating space between the portions A and C becomes the minimum distance in the normal (conventional) ¼ pitch type cell layout.

However, the separating space d2 between the portions A and C becomes considerably longer than the minimum separating distance (F) in the cell layout according to this invention, as illustrated in FIG. 3.

In the meanwhile, when the device region pattern 1 is inclined about 5 degree for the bit line 3 in the memory cell structure of the folded bit line system, the separating distances d1, d2 and d3 become substantially identical to each other in the case cell layout illustrated in FIG. 3.

In such a cell layout, when the cell sizes are identical to each other, the separating distances d1, d2 and d3 of the device region patterns 1 can be widened. In consequence, an increase of contact resistance can be suppressed, and electrical characteristics are improved.

Moreover, when the separating distances d1, d2 and d3 of the device region patterns 1 are identical to each other, the cell size can become small. Consequently, integration can be further achieved with high density.

Figure 5:
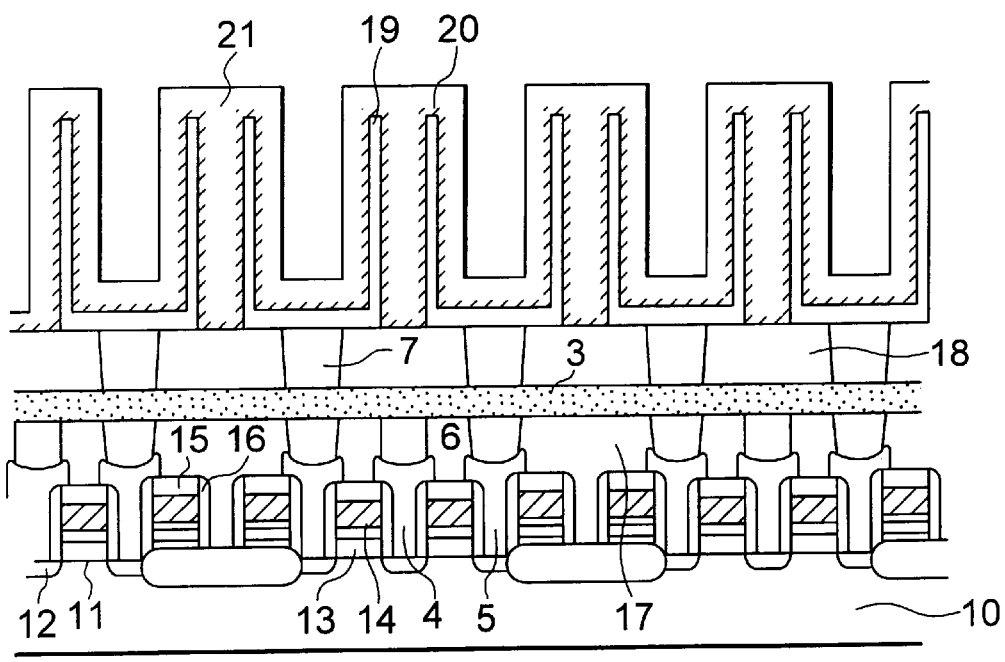
FIG. 5 is a cross sectional view, taken the memory cell layout illustrated in FIG. 3 along X—X line.

In a DRAM illustrated in FIG. 5, a gate oxide film 11 and a device separating oxide film 12 are formed on a surface of a silicon substrate 10. Further, a gate lower electrode 13 is formed on the gate oxide film 11. Herein, the gate lower electrode 13 is formed by polysilicon and has a thickness of 100 nm.

Moreover, a gate upper electrode 14 is formed on the gate lower electrode 13. Herein, the gate upper electrode 14 is formed by WSi and has a thickness of 100 nm. In this event, the word line 2 illustrated in FIG. 3 is formed by these two electrodes 13 and 14.

A gate insulating film 15 having a thickness of about 80 nm is formed on the gate upper electrode 14. Further, a gate sidewall insulating film 16 having a thickness of about 50 nm is formed on a side surface of the gate lower electrode 13, the gate upper electrode 14 and the gate insulating film 15.

The wiring pattern 4 for the bit contact 6 and the wiring pattern 5 for the capacitor contact 7 are electrically insulated by the gate sidewall insulating film 16. The bit contact 6 is placed on the wiring pattern 4 so as to be insulated by a first interlayer insulating film 17.

Further, the capacitor contact 7 is placed on the wiring pattern 5 so that the capacitor contact 7 is insulated by the first interlayer insulating film 17 under the bit line 3 and is insulated by a second interlayer insulating film 18 over the bit line 3.

In the most upper portion, a surface of a capacitor lower electrode 19 is coated by a capacitor insulating film 20, and a capacitor upper electrode 21 is placed thereon.

(Second embodiment)

Figure 6:
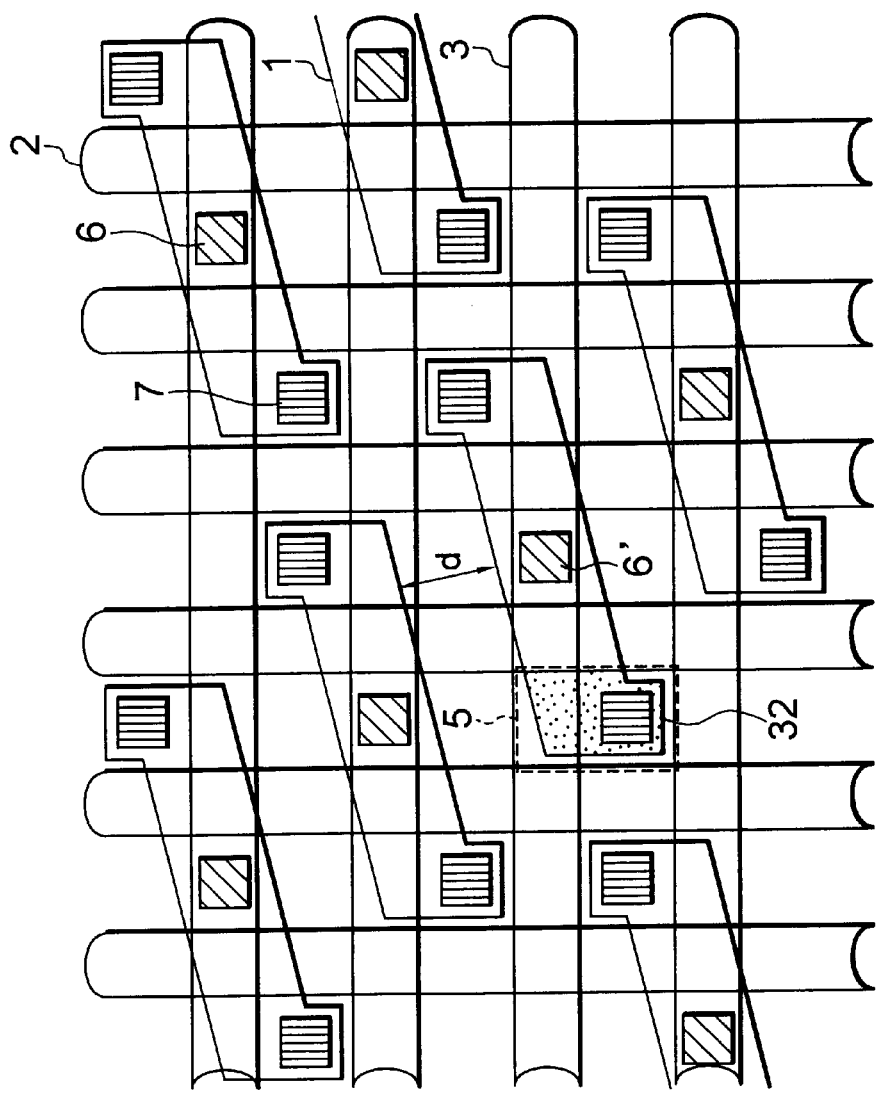
FIG. 6 is a plane view showing a memory cell structure in which cells patterns are arranged with cell wiring pattern of the folded bit system according to a second embodiment of this invention.

Referring to FIG. 6, description will be made about a semiconductor memory device according to a second embodiment of this invention.

In this memory structure, the wiring pattern 4 for bit contact 6 and the wiring pattern 5 for the capacitor contact 7 are not arranged different from the first example illustrated in FIG. 3.

In this memory cell layout, electrical connection between the capacitor contact 7 and the device region pattern 1 is directly carried out.

The device region pattern 1 has the capacitor contacts 7 at the both ends and the bit contact 6 at the center portion in the memory cell structure. The device region pattern 1 is inclined with the same angle as the first embodiment illustrated in FIG. 3 for the bit line 3.

However, the diffusion layer 32 which contacts with the capacitor contact 7 is bent and extended in the direction parallel to the word line 2 different from the first embodiment.

In the case of such a memory cell structure, the diffusion layer 32 for forming the capacitor contact 7 can be enlarged as compared to the conventional ¼ pitch type cell layout. Consequently, alignment margin of the capacitor contact 7 and the device region pattern 1 becomes large.

Further, the separating distance d from the bit contact 6' to the adjacent device region pattern 1 exceeds the minimum separating distance (F).

Even if the wiring pattern 5 for the capacitor contact 7 is formed like the first embodiment, contacting area for electrically contacting with the diffusion layer 32 becomes large. In consequence, contact resistance can be largely reduced.

Thus, if the cell layout of the second embodiment is employed, the device region (namely, the diffusion layer 32) for forming the capacitor contact 7 becomes large. As a result, the contact resistance can be reduced, as mentioned before.

In the meanwhile, when miniaturization further proceeds in the above-mentioned memory cell structure, difference between a mask and a resist pattern in the known photolithography process becomes large in shape.

In particular, shrinkage in a long side direction becomes remarkable with respect to a narrow and long pattern, such as, the device region pattern 1.

For instance, the long side direction of each device region pattern 113, 114, and 115 is shrunk in the conventional ¼ pitch type cell layout illustrated in FIG. 2.

Consequently, the diffusion layer does not sufficiently extend in the direction parallel to word line 101b, and further, alignment deviation also occurs. Thereby, the diffusion layer for the capacitor contact 106b may not be formed in the worst case.

Therefore, if the device region pattern 100b is extended in an upper direction, the space between the adjacent capacitor contacts 106b becomes too close. Thereby, it is possible that the capacitor contacts 106b contact to each other. Consequently, it is difficult to form the device region patterns 113, 114 and 115. Therefore, measure for solving this problem becomes necessary. According to the second embodiment, this problem can be solved by adopting the cell layout illustrated in FIG. 4.

(Third embodiment)

Figure 7:
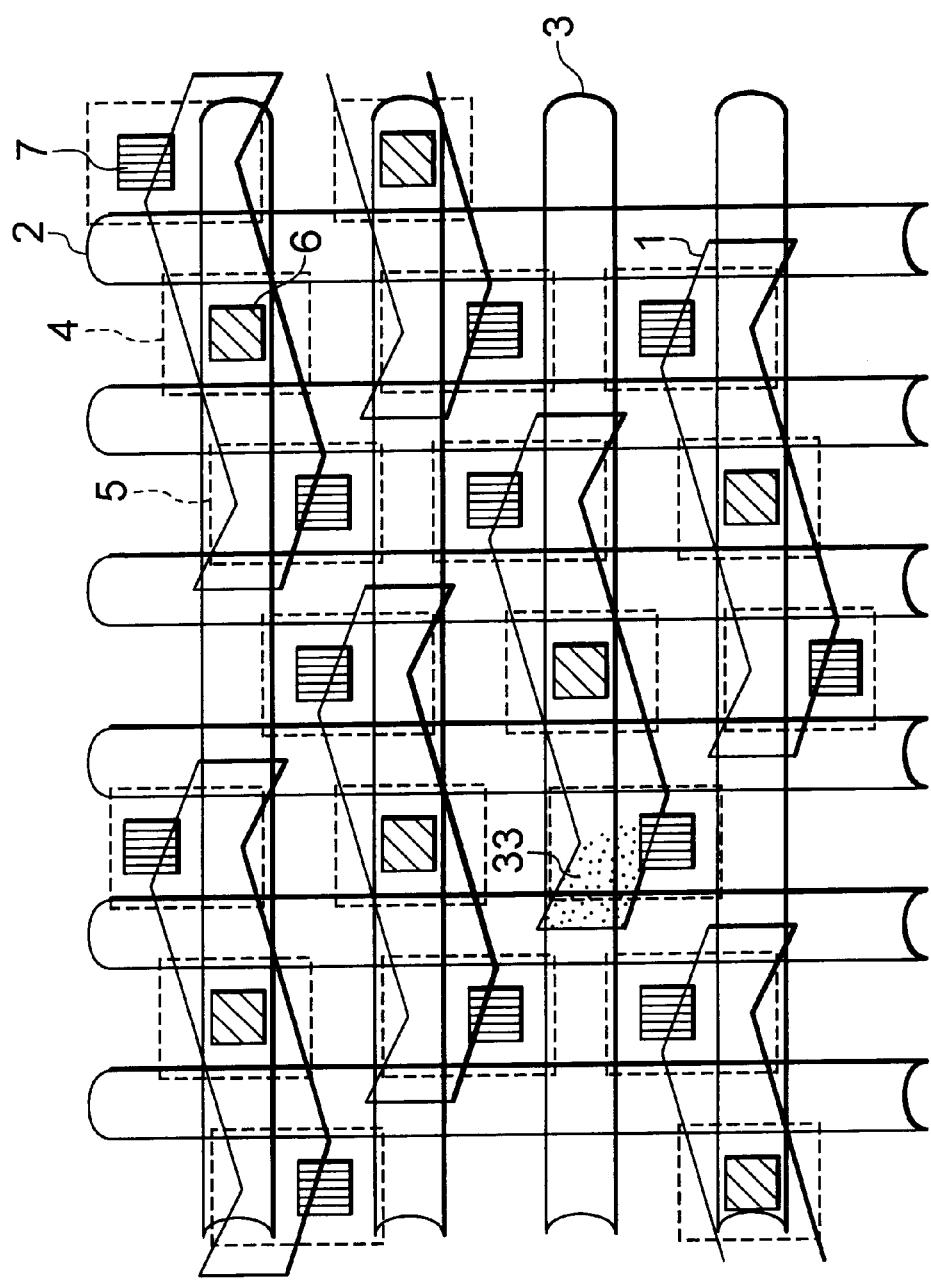
FIG. 7 is a plane view showing a memory cell structure in which cells patterns are arranged with cell wiring pattern of the folded bit system according to a third embodiment of this invention.

Referring to FIG. 7, description will be made about a semiconductor memory device according to a third embodiment of this invention.

In a memory structure according to a third embodiment, the wiring pattern 4 for the bit contact 6 and the wiring pattern 5 for the capacitor contact 7 are arranged, like the first embodiment.

The device region pattern 1 has the capacitor contacts 7 at the both ends and the bit contact 6 at the center portion in the memory cell structure. The device region pattern 1 is inclined with the same angle as the first embodiment illustrated in FIG. 2 for the bit line 3.

However, a space between adjacent capacitor contacts 7 is further widened in the third embodiment, different from the first embodiment. Namely, a diffusion layer 33 is bent and extended in a predetermined direction, as illustrated in FIG. 7. Consequently, even when the device region pattern 1 is extended in a long side direction, the device region pattern 1 does not almost contact with the other device region pattern 1.

Thus, the diffusion layer 33 is bent and extended in the third embodiment. Thereby, even when the shrinkage and the alignment deviation of the resist pattern occurs, the diffusion layer 33 for forming the capacitor contact 7 can be sufficiently formed.

Consequently, contacting area between the diffusion layer 33 and the wiring pattern 5 for the capacitor contact 7 is largely increased. As a result, increase of contact resistance can be effectively prevented.

In the cell layout of the third embodiment, even when shrinkage of a small pattern takes place in the photolithography process, it does not almost cause problems.

What is claimed is:

1. A semiconductor memory device which utilizes a folded bit line system, comprising:
    a plurality of bit lines which are placed in a parallel direction;
    a plurality of word lines which are placed in a vertical direction, said bit lines and said word lines being perpendicularly crossed to each other;
    a plurality of device region patterns which are arranged so as to cross said bit lines and said word lines;
    said device region pattern has first wiring patterns in both ends and a second wiring pattern in a center portion,
    a capacitor contact is arranged in each of said first wiring patterns,
    a bit contact is arranged in said second wiring pattern,
    a separating distance between adjacent device region patterns being equal to a first space which corresponds to a closest vertical distance between said capacitor contacts,
    a separating distance between closest portions of said adjacent device region patterns being equal to a second space,
    each of said device region pattern being inclined relative to said bit line with a predetermined angle so that the first space exceeds the second space.

2. A semiconductor memory device as claimed in claim 1, wherein:
    said first wiring pattern is patterned and arranged so as to connect said capacitor contact with a first diffusion layer.

3. A semiconductor memory device as claimed in claim 1, wherein:
    said second wiring pattern is patterned and arranged so as to connect said bit contact with a second diffusion layer.

4. A semiconductor memory device as claimed in claim 1, wherein:
    the second space exceeds a predetermined minimum separating space.

5. A semiconductor memory device as claimed in claim 1, wherein:
    each of said device region patterns is inclined with the angle which is not exceeding approximately 26 degree.

6. A semiconductor memory device as claimed in claim 5, wherein:
    each of said device region patterns is inclined with the angle which is not exceeding approximately 13 degree.

7. A semiconductor memory device as claimed in claim 1, wherein:
    each of said device region patterns is formed in a rectangular shape.

8. A semiconductor memory device as claimed in claim 7, wherein:
    each of both ends of said device region pattern is perpendicularly shaped.

9. A semiconductor memory device as claimed in claim 1, wherein:
    said device region patterns are alternately arranged at every ¼ pitch on the basis of said bit line.

10. A semiconductor memory device as claimed in claim 2, wherein:
    said first diffusion layer is bent to define a bent section with opposite sides extended in a direction parallel to said word line.

11. A semiconductor memory device as claimed in claim 2, wherein:

said first diffusion layer is bent to define a bent section with opposite sides extended in a predetermined direction defining an acute angle relative to said bit line.

12. A semiconductor memory device which utilizes a folded bit line system, comprising:

a plurality of bit lines which are placed in a parallel direction;

a plurality of word lines which are placed in a vertical direction, said bit lines and said word lines being perpendicularly crossed to each other;

a plurality of device region patterns which are arranged so as to cross said bit lines and said word lines;

a separating distance between adjacent device region patterns being equal to a first space, a separating distance between closest portions of said adjacent device region patterns being equal to a second space, each of said device region patterns being inclined relative to said bit line with a predetermined angle not exceeding approximately 13 degrees so that the first space exceeds the second space.

13. A semiconductor memory device as claimed in claim 12, wherein:

said device region pattern has first wiring patterns in both ends and a second wiring pattern in a center portion, a capacitor contact is arranged in each of said first wiring patterns, a bit contact is arranged in said second wiring pattern, and the first space corresponds to a closest vertical distance between said capacitor contacts.

14. A semiconductor memory device as claimed in claim 13, wherein:

said first wiring pattern is patterned and arranged so as to connect said capacitor contact with a first diffusion layer.

15. A semiconductor memory device as claimed in claim 13, wherein:

said second wiring pattern is patterned and arranged so as to contact said bit contact with a second diffusion layer.

16. A semiconductor memory device as claimed in claim 12, wherein:

the second space exceeds a predetermined minimum separating space.

17. A semiconductor memory device as claimed in claim 12, wherein:

each of said device region patterns is formed in a rectangular shape.

18. A semiconductor memory device as claimed in claim 17, wherein:

each of both ends of said device region pattern is perpendicularly shaped.

19. A semiconductor memory device as claimed in claim 12, wherein:

said device region patterns are alternately arranged at every ¼ pitch on the basis of said bit line.

20. A semiconductor memory device as claimed in claim 14, wherein:

said first diffusion layer is bent to define a bent section with opposite sides extended in a direction parallel to said word line.

21. A semiconductor memory device as claimed in claim 14, wherein:

said first diffusion layer is bent to define a bent section with opposite sides extended in a predetermined direction defining an acute angle relative to said bit line.

* * * * *